(12) United States Patent
Golubovic

(10) Patent No.: US 8,546,862 B2
(45) Date of Patent: Oct. 1, 2013

(54) MEMORY CELL, AN ARRAY, AND A METHOD FOR MANUFACTURING A MEMORY CELL

(75) Inventor: Dusan Golubovic, Eindhoven (NL)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/262,319

(22) PCT Filed: Apr. 19, 2010

(86) PCT No.: PCT/IB2010/051685
§ 371 (c)(1),
(2), (4) Date: Sep. 30, 2011

(87) PCT Pub. No.: WO2010/122470
PCT Pub. Date: Oct. 28, 2010

(65) Prior Publication Data
US 2012/0025287 A1 Feb. 2, 2012

(30) Foreign Application Priority Data

Apr. 22, 2009 (EP) .................................... 09158544

(51) Int. Cl.
*H01L 27/105* (2006.01)
*H01L 21/336* (2006.01)

(52) U.S. Cl.
USPC .............. 257/298; 257/325; 257/E21.423; 257/310; 257/314; 438/310

(58) Field of Classification Search
USPC ............................................. 257/314–326
See application file for complete search history.

(56) References Cited

U.S. PATENT DOCUMENTS

| 7,101,760 | B1 * | 9/2006 | Lojek .............................. 438/260 |
| 2004/0180491 | A1 | 9/2004 | Arai et al. |
| 2005/0077567 | A1 * | 4/2005 | Randolph et al. ............. 257/315 |
| 2005/0156158 | A1 * | 7/2005 | King .............................. 257/20 |
| 2005/0205969 | A1 * | 9/2005 | Ono et al. ...................... 257/645 |
| 2006/0124991 | A1 | 6/2006 | Ohba |
| 2006/0192246 | A1 * | 8/2006 | Jeon et al. ...................... 257/315 |
| 2006/0220106 | A1 * | 10/2006 | Choi et al. ..................... 257/324 |
| 2006/0261376 | A1 * | 11/2006 | Forbes et al. ................. 257/216 |
| 2007/0105310 | A1 * | 5/2007 | Chen et al. .................... 438/257 |

(Continued)

FOREIGN PATENT DOCUMENTS

CN 1832204 9/2006

OTHER PUBLICATIONS

Maeda M. et al., Oxidation of silicon nitride in a wet atmosphere, 1989, J. Mater. Sci. Lett., 24, 2120-2126.*

(Continued)

*Primary Examiner* — Julia Slutsker
*Assistant Examiner* — Natalia Gondarenko
(74) *Attorney, Agent, or Firm* — McClure, Qualey & Rodack, LLP

(57) ABSTRACT

A memory cell (100) comprising a transistor, the transistor comprising a substrate (101), a first source/drain region (102), a second source/drain region (112), a gate (104) and a gate insulating layer (103) positioned between the substrate (101) and the gate (104), wherein the gate insulating layer (103) is in a direct contact with the substrate (101) and comprises charge traps (131) distributed over an entire volume of the gate insulating layer (101).

19 Claims, 6 Drawing Sheets

(56) References Cited

U.S. PATENT DOCUMENTS

2007/0176227 A1* 8/2007 Liu et al. ............... 257/324
2008/0087945 A1* 4/2008 Forbes et al. ........... 257/325
2008/0188052 A1   8/2008 Winstead et al.
2009/0236655 A1* 9/2009 Choi et al. ............. 257/325

OTHER PUBLICATIONS

Chen D et al.: "Nonvolatile Flash Memory Device Using Ge Nanocrystals Embedded in HfA10 High-k Tunneling and Control Oxides: Device Fabrication and Electrical Performance" IEEE Transactions on Electron Devices, IEEE Service Center, Pisacataway, NJ, US.

International Search Report as published with WO 2010/122470 on Oct. 28, 2010.

Chinese language office action dated Feb. 5, 2013.

English language translation of abstract of CN 1832204 (published Sep. 13, 2006).

Maeda, M., et al.; "Oxidation of Silicon Nitride in a Wet Atmosphere;" Journal of Materials Science Letters 24; Jun. 30, 1989; pp. 2120-2126.

* cited by examiner

MEMORY CELL, AN ARRAY, AND A METHOD FOR MANUFACTURING A MEMORY CELL

CROSS-REFERENCE TO RELATED APPLICATION

This application is the 35 U.S.C. §371 national stage of PCT application "A Memory Cell, An Array, And A Method For Manufacturing A Memory Cell," having serial number PCT/US2010/051685, filed on Apr. 19, 2010 which claims priority to and benefit of European Patent Application No. 09158544.8 filed on Apr. 22, 2009, both of which are incorporated by reference in their entirety.

FIELD OF THE INVENTION

The invention relates to a memory cell.
Furthermore, the invention relates to a memory array.
Moreover, the invention relates to a method for manufacturing a memory cell.

BACKGROUND OF THE INVENTION

A memory cell may particularly denote any physical realization of a building unit of a computer data storage device which may be used for storing one or more bits. Volatile memory cells, such as for instance random access memory (RAM) cells, particularly dynamic random access memory (DRAM) cells, require power to maintain the stored information, whereas non-volatile memory cells, such as for instance flash memory cells, can retain the stored information even when not powered. Conventional DRAM memory cells comprise a select transistor and a storage capacitor and may be referred to as one transistor—one capacitor memory cells. Performance specifications on the used transistors and capacitor can put serious constrains on the optimization of DRAMs with respect to the speed, density and/or costs.

Z-RAM memory cells that are examples of so called one transistor—zero capacitor DRAM memory cells, i.e. which do not comprise a separate capacitor, rely on an effect known as the floating body effect, which causes capacitance to be formed between the transistor and an underlying insulating substrate.

U.S. Pat. No. 5,608,250 discloses a volatile memory cell, where the charge is stored locally at the interface between a silicon substrate and a gate dielectric.

US 2007/0034922 discloses a volatile/non-volatile memory cell with a vertical surround gate. A gate insulator stack is formed as a stack of three layers: a tunnel insulator layer, a charge blocking layer and a charge trapping layer positioned between the tunnel insulator layer and the charge blocking layer.

Known volatile memory cells may be difficult and expensive to integrate in reliable high speed and high density DRAMs.

OBJECT AND SUMMARY OF THE INVENTION

It is an object of the invention to provide for a memory cell suitable for a high density computer memory, which memory cell is easy to manufacture at a low cost in a high volume production.

In order to achieve the object defined above, a memory cell, an array and a method for manufacturing a memory cell according to the independent claims are provided.

According to an exemplary embodiment of the invention, a memory cell (which may store information of one or more bits which can be read out for instance by applying a read voltage to the memory cell and monitoring a resulting read current) comprising a transistor (such as a field effect transistor, particularly a MOSFET) is provided. The transistor may comprise a substrate (such as a semiconductor substrate, for example a silicon substrate), a first source/drain region (which may be formed on and/or in a first surface portion of the substrate, for instance by implantation of a dopant), a second source/drain region (which may be formed on and/or in a second surface portion of the substrate, for instance by implantation of a dopant), a gate (which may be formed above the substrate, for instance by deposition and patterning of an electrically conductive material such as a metal or polysilicon), and a gate insulating layer (which may be formed at least partially of an electrically insulating material) positioned between the substrate and the gate, wherein the gate insulating layer is in a direct contact (for instance without an additional layer sandwiched between the gate insulating layer and the substrate) with the substrate and comprises charge traps (which may comprise semiconductive or electrically insulating inclusions, particles or structures which may be prone to capturing, trapping and maintaining negatively or positively charged charge carriers such as electrons or holes) distributed over an entire volume of the gate insulating layer (i.e. not only concentrated in a sub-volume of the gate insulating layer).

According to another exemplary embodiment of the invention, an array of a plurality of memory cells having the above mentioned features formed in a common substrate is provided.

According to still another exemplary embodiment of the invention, a method for manufacturing a memory cell is provided, wherein the method comprises providing a substrate, forming a first source/drain region, forming a second source/drain region, forming a gate and forming a gate insulating layer positioned between the substrate and the gate, wherein the gate insulating layer is in a direct contact with the substrate and comprises charge traps distributed over an entire volume of the gate insulating layer.

The term "memory cell" may particularly denote any physical realization of a building unit of a data storage device which may be used for storing one bit (for instance presence or absence of trapped charge) or more bits (for instance additionally considering polarity and/or quantity of trapped charge).

The term "charge trap" may particularly denote an energy level (for instance, a discrete energy level or a continuous energy band) in an energy band gap of the gate insulating layer specifically appropriate for storing electric charge due to trapping of electrically charged particles (for instance negatively charged electrons or positively charged holes). Regions in the gate insulating layer having such appropriate trapping energy levels may also be considered as physical structures, islands, inclusions or particles which constitute the actual charge traps. The corresponding energy levels may be referred to as trap energy levels. Charge traps (also referred to as traps) may be distributed spatially homogeneously or inhomogeneously. Also the energy distribution of the charge traps may be homogeneous or inhomogeneous. Due to, for instance a doping, a chemical reaction or a physical process traps may be actively (for instance intentionally in a controllable manner) introduced or formed in the gate insulating layer, or already existing traps may be modified. That way, for instance, concentration of traps can be changed (for instance, increased), distribution characteristic the traps (for example spatial or energy distribution characteristic, or a spatial homogeneity) may be changed and/or new (for instance discrete) trap energy levels in the energy gap can be created. Correspondingly, recombination rates and location of the recombination zone may be changed. For instance, in non-stoichiometric compounds bulk traps may be formed due to an excess or a deficiency of an element.

Charge traps may also be presents inherently in an area close to an interface of the gate insulating layer and the semiconductor substrate due to irregularities, for instance, in the crystal structure of the insulating layer in the proximity of the interface (for instance, within a distance less than 1 nm from the interface). These traps will be referred as interface traps. Creation of such interface traps and of their effects may be difficult to control.

Traps distributed in the entire volume of the gate insulating layer (for instance, at distances higher than 1 nm from the interface) will be referred to as bulk traps. Creation of such bulk traps and of their effects may be properly controllable. In an embodiment, bulk traps may be present in the entire volume of the gate insulating layer limited on side by the substrate and on an opposing side by the gate.

The term "non-stoichiometric compound" may particularly denote a chemical compounds with an elemental composition that may not be represented by a ratio of well-defined natural numbers, and therefore may violate the law of definite proportions. The non-stoichiometric compound may be a solid that may comprise crystallographic point defects that may result in an excess or a deficiency of an element. This defect may be compensated by a change in charges of other atoms in the solid, by changing their oxidation state, or by replacing them with atoms of different elements with a different charge. Examples of non-stoichiometric compound may be, for instance, silicon oxynitride, transition metal oxides (for instance hafnium oxide, zirconium oxide), particularly transition metal oxides when the metal is not in its highest oxidation state.

The term "field effect transistor" (FET) may particularly denote a transistor in which an output current (source-drain current) may be controlled by the voltage applied to a gate which can be a MOS structure (MOSFET). Such a field effect transistor may be part of a monolithically integrated circuit and may provide a function such as a memory function.

The term "layer" may particularly denote any physical structure formed by a specific material or material combination and being shaped in a planar or non-planar manner. Different portions of a patterned or non-patterned layer may be connected to one another or may form different non-connected island-like sections.

The term "source/drain region" may particularly denote a source region or a drain region. Since the functionality of a source region and a drain region may depend on the operation mode of a transistor, for instance voltages applied thereto, the term source/drain region may denote a structure which can act as a source region or as a drain region.

The term "well structure" may particularly denote a doped surface portion of a substrate. A well structure may include a channel region.

The term "gate" may denote an electrically conductive structure to which an electric voltage may be applied to control a conductivity of a channel region of a semiconductor substrate/well.

The term "gate insulating layer" may denote an at least partially electrically insulating structure which prevents a direct ohmic connection between gate and channel, thereby contributing to the field effect. For instance, the gate insulating structure may be a layer having a homogeneous thickness.

The gate insulating layer may accommodate the charge traps in an area close to an interface of the gate insulating layer and the semiconductor substrate and/or in an area close to an interface of the gate insulating layer and the gate, and/or in an interior of the gate insulating layer.

The term "type of conductivity" may denote that current is carried by positive or negative mobile charge carriers. One type of conductivity is therefore current carried by positively charged charge carriers, another type of conductivity is therefore current carried by negatively charged charge carriers. Conduction by p-type charge carriers may be denoted as a complementary conduction mechanism as compared to conduction by n-type charge carriers. Charge carriers injected into the charge traps may be of either type of conductivity.

The term "transistor" of the memory cell may denote a FET, particularly an insulated gate FET (MOSFET). The semiconductor substrate may be doped with a dopant of a first type of conductivity (for instance p-doped or n-doped). A channel region (for instance an n-channel region or a p-channel region) of the FET may be formed in a portion of the semiconductor substrate between the first source/drain region and the second source/drain region, the first and second source/drain regions being of a second type of conductivity type, which is opposite to the first conductivity type. The gate insulating layer may be formed on (for instance directly over) the channel region. The gate insulating layer may comprise bulk traps distributed over the entire volume (bulk) of the gate insulating layer. In the following only the n-channel FET based memory cell will be described for simplicity. The construction and functionality of a memory cell based on a p-channel FET is completely analogous. The gate may be, for instance, a polysilicon gate or a metal gate.

In general, the presence of bulk traps in the entire gate insulating layer may influence the current-voltage characteristic, in particular the threshold voltage, of the FET. The threshold voltage of the FET with the traps filled (that means, the electric charge being stored in the traps) will be different (for instance shifted) from the threshold voltage of the FET with the traps not being filled. Due to the provision of bulk gaps basically over the entire volume of the gate insulating layer, read-out artifacts due to asymmetric charge trap arrangement may be prevented.

The above mentioned interface traps, which may inherently be present due to irregularities caused by the interface in the gate insulating layer on the interface between the semiconductor substrate and the gate insulating layer only may effect the current-voltage characteristic of the memory cell transistor in a manner which may be difficult to control. Thus, programming data in a memory comprising only such interface traps and reading data out of such a memory may lack reliability or reproducibility. According to the exemplary embodiment of this invention the main contribution to the shift of the threshold voltage (for instance decrease of the threshold voltage in case of positive charge being trapped, or increase of the threshold voltage in the opposite case) will be due to the bulk traps. Particularly, possibly unwanted and uncontrollable effects of interface traps may be eliminated or suppressed.

Hence, the memory cell may function by storing electrical charge and releasing electrical charge from the charge traps (for instance electron traps), particularly by storing and releasing electrical charge from the bulk traps. When the bulk traps are filled by excess charge (for instance due to an injection of charge carriers by a direct tunneling of the charge carriers from the channel by a low power tunneling or by a channel hot electron injection), the negative charge present in the gate insulating layer due to the filled bulk traps may impede a formation of an inversion layer in the semiconductor substrate at its interface with the gate insulating layer, when a positive voltage is applied to the gate. Due to this effect, the threshold voltage of the FET may be raised with respect to the threshold voltage of the FET without traps or only the substrate interface traps being filled. When the bulk traps are filled (for instance due to a charge injection by direct tunneling of the charge from the channel by a low power tunneling or by a channel hot electron injection) the interface traps may be filled inherently too (for instance the interface traps may fill before the bulk traps start to fill up). However, the dominant contribution to the effect of shifting the threshold may be caused by filling the bulk traps. Hence, with fixed voltages applied to the gate, the drain and/or the source of the FET, the current flow may be modulated in a characteristic and controllable manner by the charge stored by the bulk traps. The modulated current may be unambiguously indicative of the data content of the memory cell.

Hence a simple and reliable memory cell based on a transistor can be provided, which memory cell uses in an advantageous manner capability to store the charge of bulk charge traps actively (for instance intentionally in a controllable manner) introduced, formed or modified or in the gate insulating layer. Such a memory cell may be suitable for a high density computer memory, which memory cell is easy to manufacture at a low cost in a high volume production.

Next, further exemplary embodiments of the memory cell will be explained. However, these embodiments also apply to the array and the method of manufacturing a memory cell.

The memory cell may be a horizontal gate memory cell, the horizontal orientation of the gate and the gate insulating layer being defined with respect to the semiconductor substrate. The memory cell may be implemented in a planar bulk, a planar SOI (Silicon-on-Insulator) and/or multi-gate SOI integration schemes.

According to an exemplary embodiment of the invention, a density of charge stored by the traps is higher than or equal to $5 \cdot 10^{-14}$ C/cm$^2$, in particular is higher than or equal to $10^{-13}$ C/cm$^2$.

The term "density of charge stored in the traps" may particularly denote a ratio between the absolute value of a total charge (for instance in Coulombs) which may be stored in (or by) the traps (for instance by filling up all the traps) and an active area of transistor.

The term "active area of the transistor" may particularly denote an active area of the gate insulating layer. It may be for instance an area (for instance a physical area or an effective area) of a surface of the gate insulating layer contacting the substrate over an active region of the transistor.

The density of charge which may be stored by the traps particularly depends on the density of traps (which may be a ratio between a number of traps and a volume of the insulating layer, or a ratio between the number of traps and the active area of the transistor). Therefore, in the sequel the term "density of traps" may particularly denote a density of traps corresponding as described above to the above defined density of charge stored in the traps. Such densities of charge stored in the traps may guarantee that an amount of charge sufficient for the functionality of the memory cell can be stored in the traps. Hence, a modulation of the current flow and a corresponding shift of the threshold voltage sufficient for the operation of the memory cell may be achieved due to the charge stored in the traps. Also, with these densities of charge traps (and hence, with respective densities of charges stored by the traps) effects caused by the presence of only interface traps may be eliminated. The density of bulk traps may be much higher (for instance 8-10 orders of magnitude) than the density of interface traps and the influence of interface traps may be reflected only in the sub-threshold characteristic of the transistor. Hence, with such particularly chosen densities of traps a simple and reliable memory cell can be provided.

According to an exemplary embodiment of the invention, the charge traps are homogeneously distributed over the entire volume of the gate insulating layer. In such an embodiment, a number of charge traps per volume may have a constant or may have an at least basically constant value over the entire volume of the gate insulating layer. A homogeneous distribution of the charge traps may result, for instance, from a sufficiently high density of traps. Due to the homogeneity of the traps, the current-voltage characteristic of the memory cell may be modulated more reliably. Also, the memory cell may be more robust as it may be less sensitive, for instance, to an incident ionization radiation particle or ray. Although such an incident radiation particle or ray may cause s loss of charge in traps in its path and hence establish temporarily a conductive path, the charge loss will be negligible, due to the homogeneity of traps.

According to an exemplary embodiment of the invention, the memory cell is configures as a volatile memory cell, particularly is configured as a dynamic random access memory being free of a capacitor. The term "volatile memory" may particularly denote a memory that continuously or repeatedly requires power to maintain the stored information, such as for instance a random access memory (RAM), particularly a dynamic random access memory (DRAM). The memory cell according to this exemplary embodiment of the invention may be an example of a DRAM cell, because the memory cell is storing a single bit of data in the gate insulating layer of the transistor. Hence, the charge storing function of a capacitor in a conventional DRAM cell is taken over by the bulk charge traps in the gate insulating layer of the transistor. Hence, the memory cell may be configured as a one transistor-zero capacitor memory cell. Since the charge stored in the gate insulating layer transistor may eventually leak, the charge might be needed refreshed periodically. However, in contrary to conventional DRAM cells, the retention time of the memory cell may be significantly increased and the refreshing frequency may be reduced correspondingly. The retention may be increased to few seconds (for instance the retention time may be between 1 to 10 seconds, particularly between 5 to 10 seconds) The volatile memory cell maybe referred to as a DRAM cell, more particularly as a one-transistor zero-capacitor DRAM cell, although in contrary to conventional DRAM cells the readout of the memory cell may be non-destructive, because the charge in traps may be maintained in case of reading out the memory cell. Such a volatile memory cell is very simple in construction, because only one transistor is needed to store one bit.

According to an exemplary embodiment of the invention, thickness of the gate insulating layer is in a range between 1.5 nm and 5 nm. Thicknesses of the gate insulating layer in this range may ensure that the transistor of the memory cell will be fast enough. Further, with such thicknesses of the gate insulating layer the memory cell may be operated at voltages ensuring a reliable operation of the memory cell. Moreover, the gate insulating layer may be thick enough to store sufficient charge for a reliable operation of the memory cell. With such a thickness of the gate insulating layer the effects due to interface traps (for instance interface traps due to irregularities caused by the interface between the semiconductor substrate and the gate insulating layer) may be suppressed, since the relative influence of such surface effects can be made sufficiently small with a sufficiently thick bulk charge trap insulating layer.

According to an exemplary embodiment of the invention, the gate insulating layer comprises silicon oxynitride, particularly non-stoichiometric silicon oxynitride. The non-stoichiometric silicon oxynitride $SiO_xN_y$ may be obtained through an oxidation of silicon nitride. Due to the oxidation the structure of the energy gaps of the silicon nitride may be modified. This modification may result in a high density of the bulk traps in the silicon oxynitride $SiO_xN_y$ (for instance, the charge density of charge which may be stored in traps may be higher than or equal to $5.10^{-14}$ C/cm$^2$, in particular may be higher than or equal to $10^{-13}$ C/cm$^2$). If the non-stoichiometric silicon oxynitride is oxygen-rich (for instance with oxygen content in a range between 10% and 20%) a high bulk trap density and homogeneity (for instance spatial homogeneity and/or homogeneity in the energy levels) of the bulk traps may be achieved. Such a density of bulk traps may be particularly achieved due to a wet oxidation, in which case two kinds of bulk traps may be formed. Shallower bulk traps (for instance with an activation energy between 0.5 eV to 1.5 eV, particularly around 1 eV) may result from silicon dangling bonds (for instance silicon atoms missing a neighbor to which it would be able to bind). Deeper bulk traps (for instance with an activation energy between 1.5 eV to 2 eV, particularly around 1.76 eV) may result from hydrogen centres (for instance H$^+$ ions) created in the gate insulating layer in course of the reactive wet oxidation.

According to an exemplary embodiment of the invention, the gate insulating layer comprises a high-K material layer, particularly a non-stoichiometric high-K material layer. The non-stoichiometric high-K material may be used, such as for example a non-stoichiometric zirconium oxide $ZrO_x$ or hafnium oxide $HfO_x$ with an atomic percentage of Zr or Hf in a range between 50% and 90%.

The term "high-K material" may denote a material with a dielectric constant higher as compared to silicon dioxide used in semiconductor manufacturing processes (for instance K may be in a range between 6 and 30 in case of a high-K material thin film). The implementation of a high-K gate material may allow for a miniaturization of the memory cell. This is because the gate capacitance and thereby drive current and transistor performance can be increased and the same or decreased thickness of the gate insulating layer, without concomitant leakage effects. Sufficient drive current of the FET can be achieved at small thicknesses (for instance less than 5 nm) of the gate insulating layer, when a non-stoichiometric high K-material is used. A high density of the bulk charge traps may be achieved particularly when the non-stoichiometric zirconium oxide $ZrO_x$ or hafnium oxide $HfO_x$ is used. The high density of bulk traps may result particularly from a crystallizing, for instance by an annealing procedure, of the gate insulating layer during a manufacturing process.

A gate comprising metal may be of an advantage particularly in combination with the high K-material used for the gate insulating layer. Such a transistor memory cell will be very fast, because of an optimal charging and discharging of the gate capacitance of the transistor due to a near-zero electrical resistance of the metallic material of the gate. In other embodiments, non-metallic gate materials may be used, for instance a gate made of an electrically conductive polycrystalline silicon.

According to an exemplary embodiment of the invention, an array of a plurality of memory cells is provided formed in a common substrate. The array of a plurality of memory cells can be used in order to provide for a fast, reliable and structurally simple computer memory of a DRAM type. For instance the array may be a matrix array. Gates of memory cells of one row may be connected to a common wordline. Drains (or second source/drain regions) of memory cells of one column may be connected to a common bitline. Sources of memory cells in one row may be connected to a common source signal line. Source (or first source/drain region) signal lines may then be connected to a common control line. With this simple arrangement of the array of the memory cells the operations of writing a cell (write), reading a cell (read or read-out) and erasing a cell (erase) can be done by applying proper voltages to the gates, drains and sources of the memory cells in the array, respectively. Both a low power tunneling operation scheme or a channel hot electron (high energy electron) injection scheme may be used for operating the array of a plurality of memory cells. The manufacturing method of the memory cell may be independent on the operation scheme used.

According to an exemplary embodiment of the invention, the array is adapted as a monolithically integrated circuit. A memory periphery may be positioned adjacent to the array of a plurality of memory cells in the monolithically integrated circuit. The memory periphery may comprise logic circuits for control of read, write and/or erase operations to the memory cells. In particular, the memory periphery may comprise transistors comprising gate dielectrics, which gate dielectrics may be different from the gate dielectrics used in the memory cells for trapping electric charge (that means, different from the gate insulating layer; for instance $SiO_2$ and/or SiON, $Al_2O_3$, $Ta_2O_5$, $HfO_2$, $ZrO_2$, $Pr_2O_3$, $Gd_2O_3$, $Y_2O_3$, $HfSiO_4$, ZrSiO4, etc.).

A read-out of an individual memory cell may be performed similarly to a flash memory cell. Also similarly to flash memory devices, before a new set of data is stored in the array of a plurality of memory cells all transistors will be erased. Therefore, the design of the memory periphery may be advantageously taken over from, for instance, available flash/$E^2$PROM design. Hence, additional costs due to possible modifications of the memory periphery may be avoided.

The monolithically integrated circuit may comprise further devices used for operating and or connecting of the array and/or the memory periphery. The monolithically integrated circuit may be manufactured in CMOS technology. CMOS technology, particularly the latest generation thereof, allows manufacturing structures with very small dimensions. A CMOS process may be a preferred choice. The integrated circuit may be monolithically integrated on the basis of a semiconductor substrate, particularly comprising one of the group consisting of a group IV semiconductor (such as silicon or germanium), and a group III-group V semiconductor (such as gallium arsenide). The integrated circuit may be formed starting with a purely crystalline silicon wafer or an SOI wafer (Silicon On Insulator). Individual memory cells may be isolated within a common substrate using silicon trench isolation (STI) technology.

Next, further exemplary embodiments of the method will be explained. However, these embodiments also apply to the memory cell and the array.

According to an exemplary embodiment of the invention, the forming of the gate insulating layer comprises forming a silicon oxynitride layer, particularly forming a non-stoichiometric silicon oxynitride layer. Hence, a gate insulating layer can be formed with a high density of bulk traps. The corresponding density of the charge which can be trapped by bulk traps may be higher than or equal to $5.10^{-14}$ C/cm$^2$, in particular may be higher than or equal to $10^{-13}$ C/cm$^2$.

According to an exemplary embodiment of the invention, the forming of the silicon oxynitride layer comprises forming (for instance depositing) a silicon nitride layer on the substrate, and exposing the silicon nitride layer to a wet oxidation (for instance exposing it to an oxidizing environment) to thereby convert the silicon nitride layer into the silicon oxynitride layer, in particular into the non-stoichiometric silicon oxynitride layer. Due to the wet oxidation (also referred to as a reactive wet oxidation), the structure of the energy gaps of the silicon nitride may be modified, and the modification may result in a high density of the bulk traps in the silicon oxynitride $SiO_xN_y$. Due to the wet oxidation two kinds of bulk traps may be formed. The resulting non-stoichiometric silicon oxynitride may contain shallower bulk traps (for instance with an activation energy between 0.5 eV to 1.5 eV, particularly around 1 eV) due to silicon dangling bonds (for instance silicon atoms missing a neighbor to which it would be able to bind) being formed in the oxidation process. The resulting non-stoichiometric silicon oxynitride may contain also deeper bulk traps (for instance with an activation energy between 1.5 eV to 2 eV, particularly around 1.76 eV) due to hydrogen centres (for instance $H^+$ ions) formed in the gate insulating layer in course of the wet oxidation. If the non-stoichiometric silicon oxynitride is oxygen-rich (for instance with oxygen content in a range between 10% and 20%) also a high homogeneity (for instance spatial and/or energetic homogeneity) of the bulk traps may be achieved.

According to an exemplary embodiment of the invention, the forming the gate insulating layer comprises forming a High-K material, particularly forming a non-stoichiometric high-K material layer, on the substrate. The non-stoichiometric high-K material may be, for example, a non-stoichiometric zirconium oxide $ZrO_x$ or hafnium oxide $HfO_x$ with an atomic percentage of Zr or Hf in a range between 50% and 90%.

According to an exemplary embodiment of the invention, the forming the high-K material layer comprises a crystallization of the high-K material layer, particularly a crystallization of the high-K material layer by an annealing procedure. Such a crystallization process, particularly a crystallization process using annealing procedure (for instance a low temperature annealing using temperatures between 500-600° C.), may lead to a formation of bulk traps with a high density (than means bulk traps capable of storing charge with a high density) in the gate insulating layer. At the same time such low temperatures may have no adverse effect on surrounding devices and circuitry.

Any process technologies like CMOS, BIPOLAR, BICMOS may be implemented. Micro- and nano-technologies like lithography, etch or deposition techniques may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
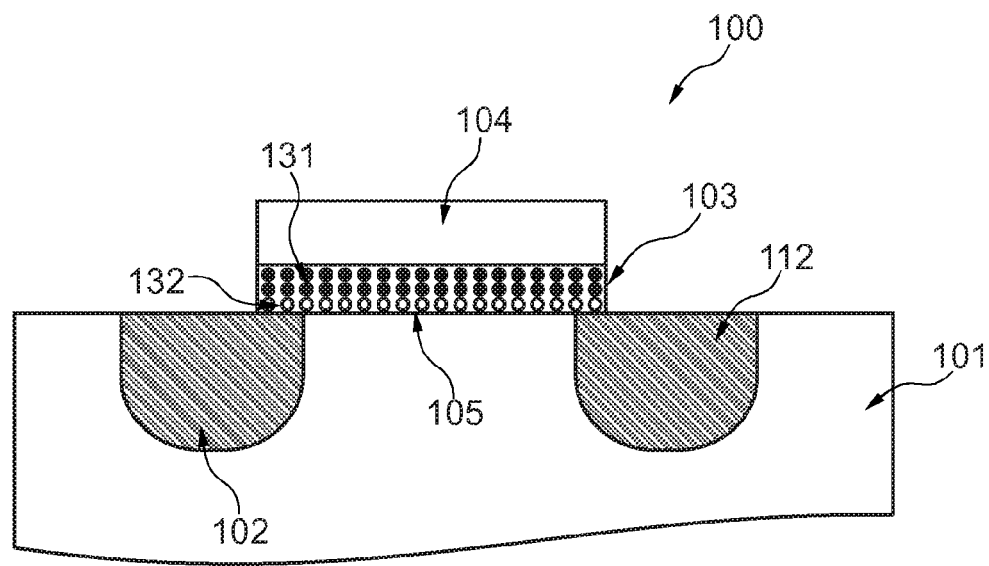
FIG. 1 illustrates a cross-sectional view of a memory cell according to an exemplary embodiment of the invention.

The illustration in the drawing is schematical.

FIG. 1 illustrates a cross-sectional view of a memory cell according to an exemplary embodiment of the invention. The memory cell 100 is an example of a horizontal gate volatile memory cell, particularly of a dynamic random access memory (DRAM) cell comprising an n-channel field effect transistor (MOSFET). The MOSFET comprises a p-type doped silicon substrate 101 and an n-type source region 102 and an n-type drain region 112, the source region 102 and the drain region 112 being separated by a part of the substrate 101. A gate insulating layer 103 shares an interface 105 with the substrate 101 so that that the source region 102 and the drain region 112 are situated at either end of the interface. The source region 102 and the drain region 112 may be as shown (or maybe not) partially covered by the gate insulating layer 103. The gate insulating layer 103 comprises an oxygen-rich (for instance with oxygen content in a range between 10% and 20%) non-stoichiometric silicon oxy-nitride ($SiO_xN_y$) with a high density of bulk traps 131 located in the bulk of the gate insulating layer 103. The density of charge which can be stored in bulk traps is higher than or equal to $5.10^{-14}$ $C/cm^2$, in particular is higher than or equal to $10^{-13}$ $C/cm^2$. The gate insulating layer 103 may also comprise interface traps 132 located in closed proximity of the interface 105. The gate insulating layer 103 maybe of a thickness which is less than 5 nm, in particular its thickness may be between 1 nm and 5 nm. The interface traps 132 may be located within a distance of less than 1 nm from the interface 105. The bulk traps 131 may be located within a distance of more than 1 nm from the interface 105. The MOSFET comprises a gate 104, which may be a polysilicon gate or a metal gate.

Figure 2:
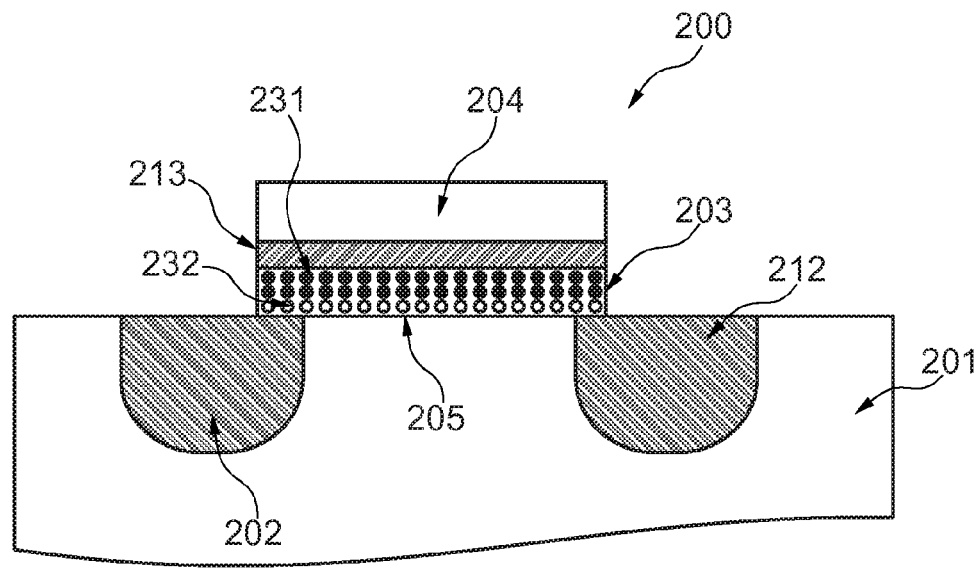
FIG. 2 illustrates a cross-sectional view of a memory cell according to another exemplary embodiment of the invention.

FIG. 2 illustrates a memory cell according to an exemplary embodiment of the invention. Also the memory cell 200 is an example of a horizontal gate volatile memory cell, particularly of a dynamic random access memory (DRAM) cell comprising an n-channel field effect transistor (MOSFET). The MOSFET comprises a p-type doped silicon substrate 102 and an n-type source region 202 and an n-type drain region 212, the source region 202 and the drain region 212 being separated by a part of the substrate 201. A gate insulating layer 203 shares an interface 205 with the substrate 201 so that that the source region 202 and the drain region 212 are situated at either end of the interface. The source region 202 and the drain region 212 may be as shown (or maybe not) partially covered by the gate insulating layer 203. In this exemplary embodiment, the gate insulating layer 203 is a high K-material layer comprising a pure binary high-K oxide, such as for example non-stoichiometric hafnium oxide ($HfO_x$, for instance with x being in a range between 0.1 and 0.5) or zirconium oxide ($ZrO_x$, for instance with x being in a range between 0.1 and 0.5) with a high density of bulk traps 231 located in the bulk of the gate insulating layer 203. The density of the charge which may be stored in bulk traps 231 may be higher than or equal to $5.10^{-14}$ C/cm$^2$, in particular may be higher than or equal to $10^{-13}$ C/cm$^2$. The gate insulating layer 203 may also comprise interface traps 232, located at the interface 205. The gate insulating layer 203 maybe of a thickness which is less than 5 nm, in particular its thickness may be between 1 nm and 5 nm. The interface trap 332 may be located within a distance of less than 1 nm from the interface 205. The bulk trap 231 may be located within a distance of more than 1 nm from the interface 205. Optionally, a further high-K material layer 213 may be positioned between the gate insulating layer 203 and a metal gate 204. The further high-K material layer may comprise oxides, such as for instance $Al_2O_3$, $Ta_2O_5$, $HfO_2$, $ZrO_2$, $Pr_2O_3$, $Gd_2O_3$, $Y_2O_3$, $HfSiO_4$, $ZrSiO_4$, etc. which are different from the material comprised by the non-stoichiometric high-K dielectric layer. In particular, such a further high-K material layer may result from a process in which periphery transistors are manufactured (for instance periphery transistors which are supposed to operate at high speeds and low voltages). In this case the equivalent oxide thickness of the further gate insulating layer may be less than 1 nm, so that the properties (for instance the charge trapping properties) of the first gate insulting layer will not be affected. The term "equivalent oxide thickness" may particularly denote the thickness of a $SiO_2$ layer needed in order to obtain the same capacitance of the transistor as the capacitance defined by the high-K material layer used.

Figure 3A:
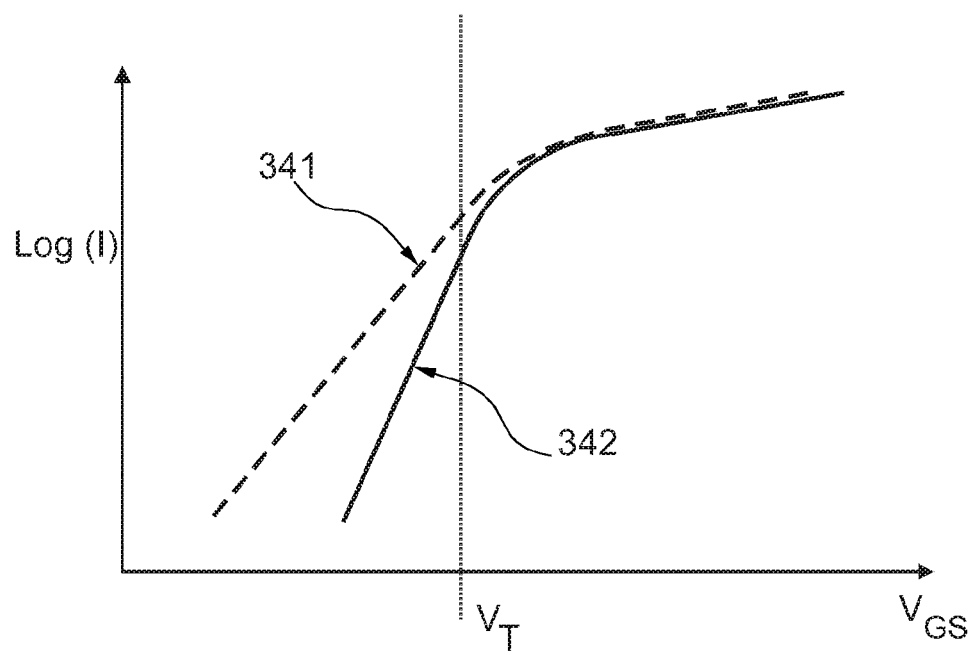
FIG. 3a illustrates a modification of a current-voltage characteristic of a memory cell according to an exemplary embodiment of the invention due to a filling of interface traps.

FIG. 3a illustrates a modification of a current-voltage characteristic of a memory cell according to an exemplary embodiment of the invention due to a filling of interface traps. For a further comparison with FIG. 3b it is assumed that the gate insulating layer comprises interface traps (for instance due to irregularities caused by the interface) as well as bulk traps. Hence, in a process of filling traps, the interface traps will be filled before the bulk traps will start to fill up. The current-voltage characteristic (curve) 342 with no traps filled and the current-voltage characteristic (curve) 341 with only interface traps filled are shown as graphs representing dependencies of the logarithms of respective transistor currents I on a voltage $V_{GS}$ applied between the gate and the source (gate-source voltage) of the transistor of the memory cell. It can be seen that in the subthreshold region (that means below a threshold voltage $V_T$) the transistor current will be shifted when the interface traps are filled. The threshold voltage $V_T$ indicates the threshold voltage of the memory cell without interface traps (and hence also without bulk traps) being filled.

Figure 3B:
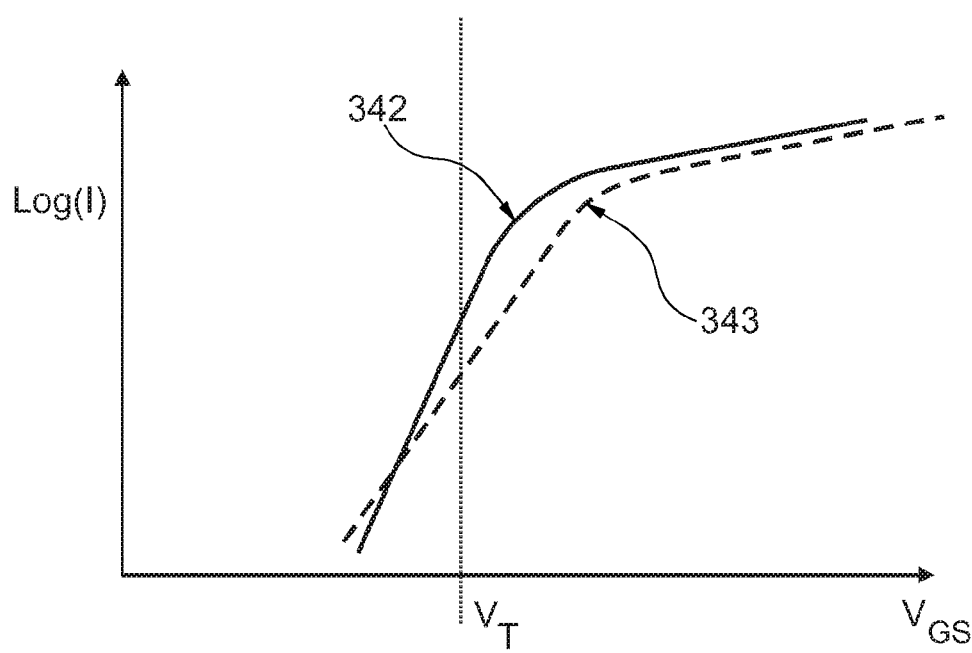
FIG. 3b illustrates a modification of a current-voltage characteristic of a memory cell according to an exemplary embodiment of the invention due to a filling of bulk traps.

FIG. 3b illustrates a modification of a current-voltage curve of a memory cell according to an exemplary embodiment of the invention due to a filling of bulk traps. In order to compare FIG. 3b and FIG. 3a it is again assumed that the gate insulating layer comprises interface traps as well as bulk traps. Hence, in a process of filling traps, the interface traps will be filled before the bulk traps will start to fill up. Also here, a threshold voltage $V_T$ indicates the threshold voltage of the memory cell without interface and bulk traps being filled. As before, the curve 342 shows the current-voltage characteristic with no traps filled (that means, before interface traps are filled). The curve 343 shows the current-voltage characteristic with bulk traps (and hence, also the interface traps) filled. It can be seen that in a region, which region starts in the subthreshold region, includes the threshold voltage $V_T$, and continues up to the saturation region, for the same value of the gate-source voltage $V_{GS}$ the transistor current will be lower when the interface traps and the bulk traps are filled. In particular the threshold voltage after also the bulk traps have been filled is higher than the threshold voltage $V_T$. The shift of the voltage will be proportional to the charge stored in the bulk traps and inversely proportional to the dielectric permittivity of Si. The charge stored by the bulk traps may depend on electric field in the gate insulating layer and, on the duration of pulse and also on tunneling used (for instance direct tunneling, Fowler-Nordheim tunneling, etc.). As can be seen, the dominating contribution to the transistor current flow modification (modulation) is due to the bulk traps.

Figure 4:
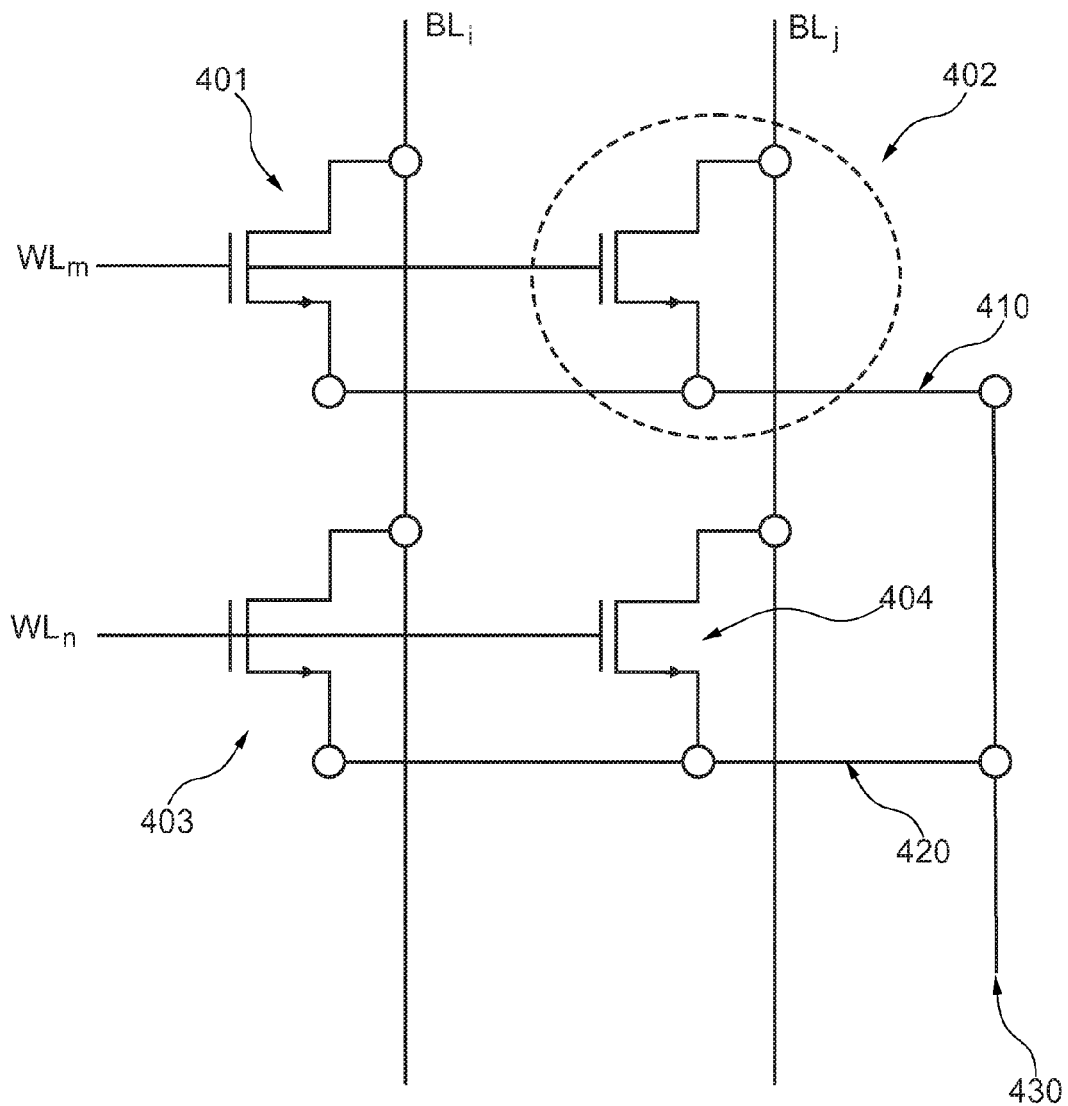
FIG. 4 illustrates an array of a plurality of memory cells according to an exemplary embodiment of the invention.

FIG. 4 illustrates an array of a plurality of memory cells according to an exemplary embodiment of the invention. For simplicity, only a part of a matrix array comprising four memory cells 401, 402, 403 and 404 is shown. However, the whole matrix array can be a matrix array of M×N memory cells with M and N being arbitrary natural numbers. Gates of memory cells 401 and 402 are connected to a wordline $WL_m$ and gates of memory cells 403 and 404 are connected to a wordline $WL_n$. Drains of memory cells 401 and 403 are connected to a bitline $BL_i$, and drains of memory cells 402 and 404 are connected to a bitline $BL_j$. Sources of memory cells 401 and 402 are connected together on a first common source signal line 410 and sources of memory cells 403 and 404 are connected together to a second common source signal line 420. The source signal lines 410 and 420 are connected to a control signal line (CSL) 430. Writing, erasing and reading (also refereed to as write, erase, and read or read-out, respectively) of a memory cell in a low power tunneling operation scheme will be described in the example of the memory cell 402.

In order to write the memory cell 402 (that means, write the logic "1"), a write voltage $V_W$ is applied only to the wordline $WL_m$, whereas the all other wordlines (for instance $WL_n$) are grounded (that means, connected to ground). The bitline $BL_j$, is connected to ground, whereas all other bitlines (for instance $BL_i$) are connected to a voltage $V_B$ sufficient to reduce disturb (that means a possible effect of the write voltage $V_W$) of the transistors connected to bitlines other than $BL_j$. For instance, if the wordline $WL_m$ is connected to 3.3 V the bitlines different from $BL_j$ can be connected to 1.8 V. The CSL 430 is kept floating (not connected to any signal) during a write cycle. The write operation may performed with available periphery voltages, thus, without using charge pumps and cascaded stages to handle voltages higher than maximal allowed voltages, if the current drive of the memory cells is sufficient to meet speed requirements. If a higher wordline voltage for write has to be generated, the charge pumps and cascaded stages may be used.

The erase is performed using negative voltages, that is, using charge pumps. It is carried out by applying a low negative voltage (of around −1V) to all wordlines, by grounding all bitlines and floating the CSL 340.

The read is performed by applying a $V_{DD}$ voltage (for instance between 1 and 1.9 V) to the wordline $WL_m$ and the bitline $BL_j$, while grounding all other wordlines and bitlines (for instance $WL_n$ and $BL_j$). The current through the CSL 430 is compared to a current of a reference transistor and is used to determine whether the value "1" or the value "0" is stored (i.e., whether the logic "1" or logic "0" is written) in the memory cell 402. For example, the values of logic "1" and "0" may be differentiated by a presence or an absence of the current in memory cell 402. The presence/absence of the current resulting from the threshold voltage being modified due to the bulk traps. Hence, the read-out may be performed similarly to flash memory devices.

The operation speed of the array of a plurality of memory cells may be increased when the array is operated by a much faster and more power consuming channel hot electron injection operation scheme. To write the memory cell 402 in the hot electron injection operation scheme positive voltages (for instance between 3 and 5 V) are applied to the wordline $WL_m$ and to the bitline $BL_j$, whereas other wordlines and bitlines are kept grounded. The voltage applied to the bitline $BL_j$ may be the same as the voltage applied to the wordline $WL_m$ or approximately one half of the latter. The CSL 430 is also connected to the ground. The read and erase are the same as for the low power tunneling operation.

Figure 5:
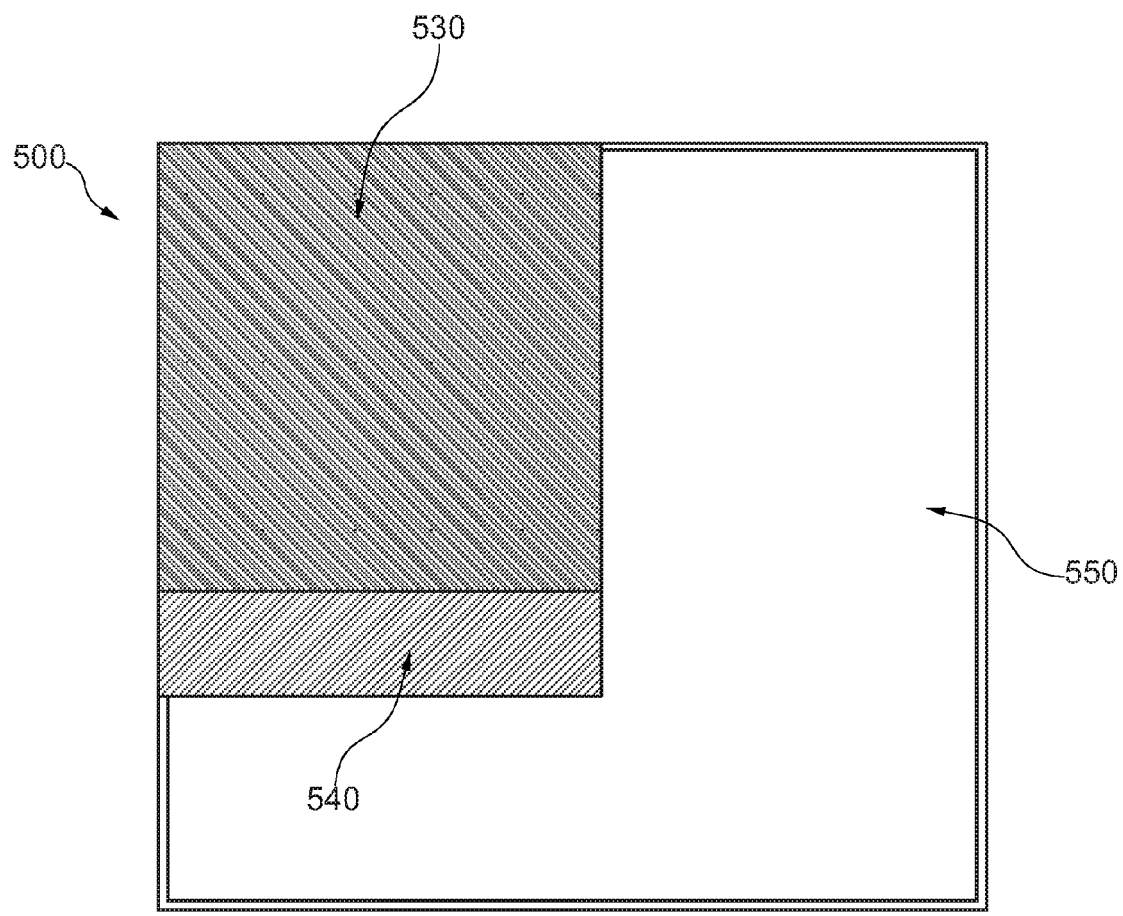
FIG. 5 illustrates a top-view an array of a plurality memory cells according to an exemplary embodiment of the invention adapted as a system on a chip.

FIG. 5 illustrates a top-view an array of memory cells adapted as a monolithically integrated circuit (system on a chip) according to an exemplary embodiment of the invention. The system on a chip 500 comprises an array 530 of memory cells described above in relation to FIGS. 1 and 2. Individual memory cells are not shown explicitly for simplicity. A memory periphery 540 is adjacent to the array 530 of memory cells. The memory periphery 540 comprises logic circuits for control of read/write operations to the memory cells. In particular, the memory periphery may comprise transistors comprising gate dielectrics, which gate dielectrics are different from the gate dielectrics used in the memory dielectrics for trapping electric charge (that means, different from dielectric used in the gate insulating layers 103, FIG. 1 or 203, FIG. 2, respectively). The design of the memory periphery may be taken over from, for instance, available flash/$E^2$PROM design. The remaining part 550 of the system on a chip 500 may comprise further devices used for operating and or connecting of the array 530 and/or the memory periphery 540.

FIG. 6a to FIG. 6f illustrate a method for manufacturing of a memory cell according to an exemplary embodiment of the invention. In FIG. 6a to FIG. 6f the method of manufacturing the memory cell comprising a gate insulating layer comprising non-stoichiometric silicon oxy-nitride is illustrated. For simplicity, only steps directly related to providing the gate insulating layer are described explicitly. The memory cell manufacturing process (for instance in a planar bulk or SOI implementation) will be explained in the context of manufacturing an integrated circuit comprising an array of a plurality of memory cells. Manufacturing process of such an integrated circuit starts with base line processing (not shown) comprising silicon trench isolation (STI) definition with bulk wafers and fin formations (for instance for multi-gate SOI devices possibly comprised by the integrated circuit). Next, implantations for a p/n-well-definition and possible threshold voltage options are performed (not shown). After removing sacrificial oxide used for these implantations, surface of a wafer is cleaned by a hydrophilic oxidizing clean, which leaves a thin flat chemical oxide on the surface (not shown).

Figure 6A:
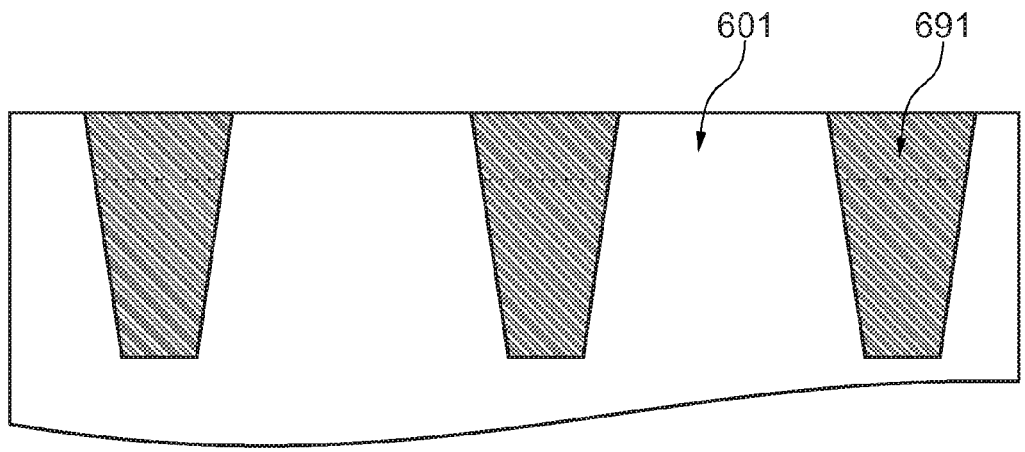
FIG. 6a to FIG. 6f illustrate a method for manufacturing of a memory cell according to an exemplary embodiment of the invention.

FIG. 6a shows a resulting n-doped semiconductor substrate 601, with trenches 691 for isolating the individual memory cells within the substrate 601. The substrate 601 is shown from a cross-sectional view orthogonal to that of FIG. 1 and FIG. 2, the plane of the cross-sectional view intersecting the memory cell between its source region (not shown) and drain region (not shown).

Figure 6B:
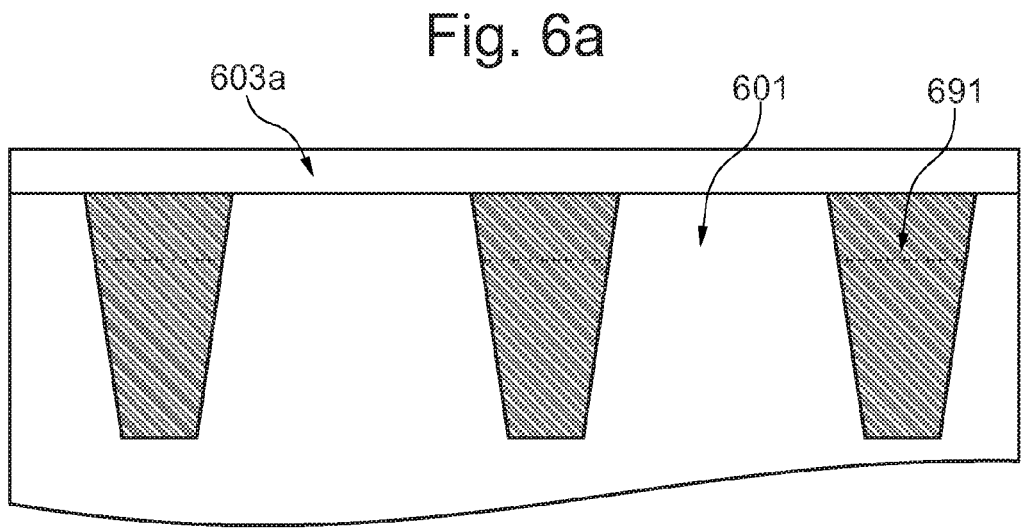

FIG. 6b shows a deposition of a thin layer (with a thickness less than 5 nm) of silicon nitride 603a. As a deposition technique any CMOS deposition technique (for instance any form of a physical vapour deposition (PVD), chemical vapour deposition (CVD), plasma enhanced chemical vapor deposition (PECVD), atomic layer deposition (ALD), sputtering etc.) can be used.

Next, the silicon nitride layer 603a is exposed to a reactive wet oxidation in order to convert the silicon nitride of the layer 603a into a non-stoichiometric silicon oxy-nitride ($SiO_xN_y$) with a high density of bulk traps (for instance a density of bulk traps being arranged such that charge with a density higher than or equal to $5.10^{-14}$ C/cm$^2$, in particular higher than or equal to $10^{-13}$ C/cm$^2$, can be stored in the bulk traps.

Figure 6C:
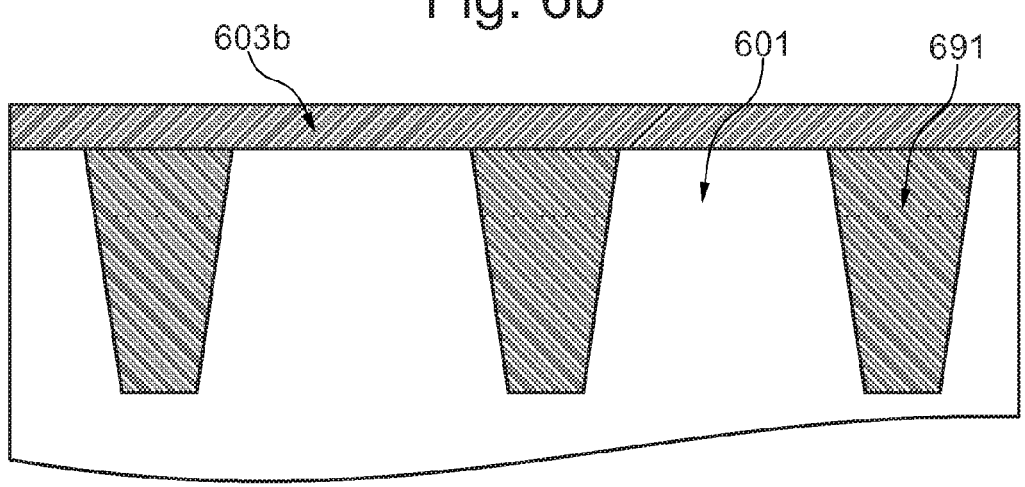

FIG. 6c shows a non-stoichiometric silicon oxy-nitride layer 603b resulting from the above described oxidation. For simplicity, the bulk traps are not indicated in this and subsequent figures.

Figure 6D:
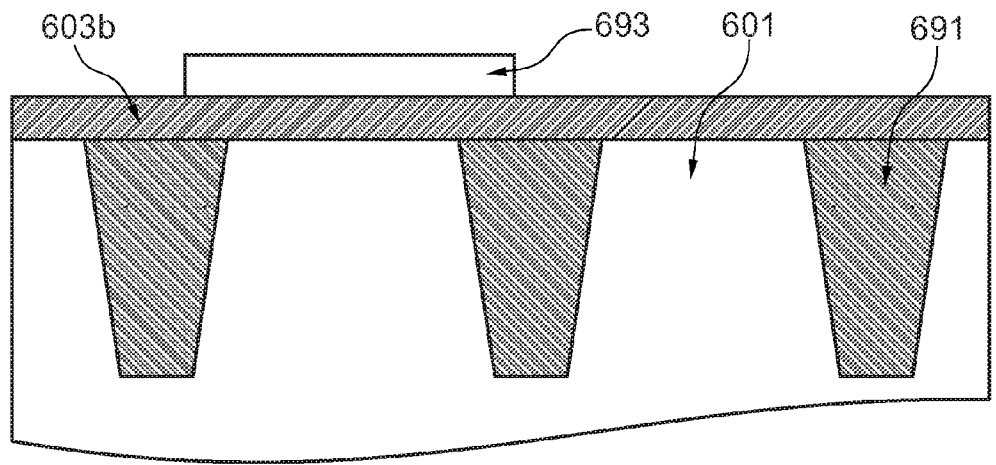

In FIG. 6d a light-field lithographic mask 693 is applied and the $SiO_xN_y$ layer is wet-etched (for instance using phosphoric acid or hydrogen fluoride (HF)) everywhere except in the area to be occupied by the memory cells.

Figure 6E:
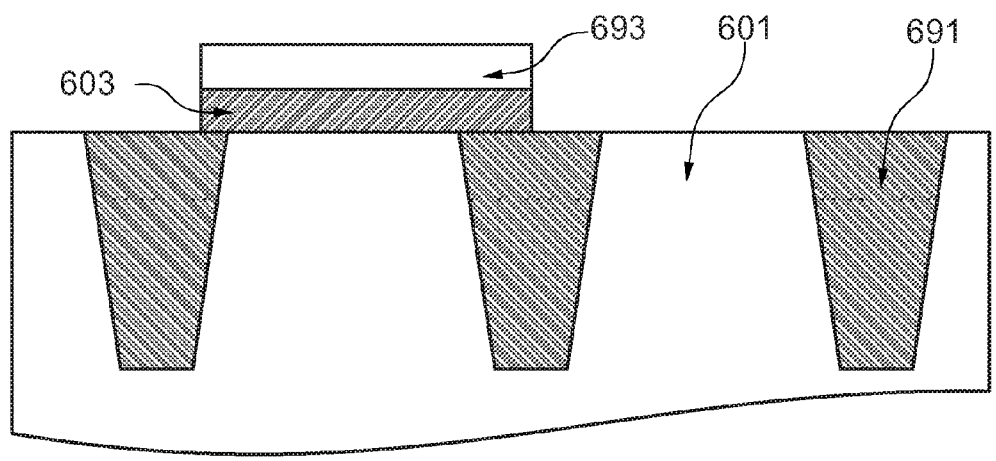
Figure 6F:
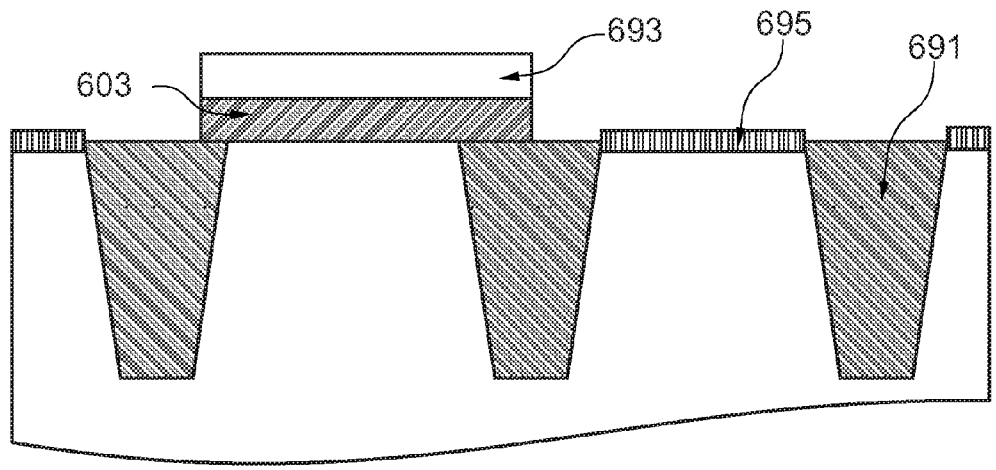

FIG. 6e shows a part 603 of the $SiO_xN_y$ layer left to form the gate insulating layer of the memory cell.

The processing continues further as shown in FIG. 6e by a growth of gate insulating layers 695 of transistors in the memory periphery. Subsequent steps (not shown) comprise among other steps also providing a gate (for instance a poly-silicon gate and/or a metal gate) without any modifications to the defined baseline. As it can be seen only one non-critical mask (693) is used in addition to CMOS baseline processing steps.

The method of manufacturing the memory cell comprising a gate insulating layer comprising a non-stoichiometric high-K material is analogous. Here, only the different steps will be described. Instead of depositing the silicon nitride layer 603a and its following oxidation resulting a in the $SiO_xN_y$ layer as illustrated in FIGS. 6b and 6c, now a pure binary high-K oxide (for instance $Hf_x$ or $ZnO_x$) layer with a high density of bulk traps (for instance the density of charge stored in the traps may be higher than or equal to $5.10^{-14}$ C/cm$^2$, in particular it may be higher than or equal to $10^{-13}$ C/cm$^2$) and with the thickness approximately 5 nm or less is deposited on the silicon substrate in order to form the gate insulating layer. As a deposition technique any CMOS deposition technique (for instance any form of a physical vapour deposition (PVD), chemical vapour deposition (CVD), plasma enhanced chemical vapor deposition (PECVD), atomic layer deposition (ALD), sputtering etc.) can be used. A light-field lithographic mask is applied and the gate insulating layer is wet-etched (for instance using phosphoric acid or hydrogen fluoride (HF)) everywhere except in the area to be occupied by the memory cells. Further, a low temperature (for instance between 500-600° C.) anneal is applied for 1 to 2 minutes to crystallize the deposited high-K oxide layer, which layer forms the gate insulating layer. The processing further continues as defined in the baseline. In this exemplary embodiment a further high-K material (for instance $Al_2O_3$, $Ta_2O_5$, $HfO_2$, $ZrO_2$, $Pr_2O_3$, $Gd_2O_3$, $Y_2O_3$, $HfSiO_4$, $ZrSiO_4$, etc.) layer may optionally be deposited (for instance using the same CMOS deposition techniques as mentioned above) with an equivalent oxide thickness less than 1 nm on the high-K insulating layer. In the same processing step the further high-K material may be used for a growth of gate insulating layers of transistors in the memory periphery.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A memory cell comprising a transistor, the transistor comprising:
   a substrate;
   a first source/drain region;
   a second source/drain region;
   a gate; and
   a gate insulating layer positioned between the substrate and the gate,
   wherein the gate insulating layer is in a direct contact with the substrate and comprises charge traps distributed over an entire volume of the gate insulating layer, and
   wherein the gate insulating layer comprises a non-stoichiometric compound and the charge traps comprise bulk traps located in a bulk of the gate insulating layer and interface traps located in closed proximity of an interface between the substrate and the gate insulating layer, and wherein the interface traps are located within a first distance from the interface and the bulk traps are located within a second distance from the first distance, and wherein the second distance exceeds the first distance, and wherein a density of the bulk traps is higher than that of the interface traps by 8-10 orders of magnitude.

2. The memory cell of claim 1, wherein a density of charge stored in the traps is higher than or equal to $5 \cdot 10^{-14}$ C/cm$^2$.

3. The memory cell of claim 1, wherein the memory cell is configured a dynamic random access memory being free of a capacitor.

4. The memory cell of claim 1, wherein a thickness of the gate insulating layer is in a range between 1.5 nm and 5 nm.

5. The memory cell of claim 1, wherein the gate insulating layer comprises silicon oxynitride.

6. The memory cell of claim 1, wherein the gate insulating layer (203) comprises a high-K material layer.

7. An array of a plurality of memory cells according to claim 1 formed in a common substrate.

8. The array according to claim 7 adapted as a monolithically integrated circuit.

9. A method for manufacturing a memory cell, the method comprising:
   providing a substrate;
   forming a first source/drain region;
   forming a second source/drain region;
   forming a gate; and
   forming a gate insulating layer positioned between the substrate and the gate,
   wherein the gate insulating layer is in a direct contact with the substrate and comprises charge traps distributed over an entire volume of the gate insulating layer, and
   wherein the gate insulating layer comprises a non-stoichiometric compound and the charge traps comprise bulk traps located in a bulk of the gate insulating layer and interface traps located in closed proximity of an interface between the substrate and the gate insulating layer, and wherein the interface traps are located within a first distance from the interface and the bulk traps are located within a second distance from the first distance, and wherein the second distance exceeds the first distance, and wherein a density of the bulk traps is higher than that of the interface traps by 8-10 orders of magnitude.

10. The method according to claim 9, wherein the forming the gate insulating layer comprises forming a silicon oxynitride layer.

11. The method according to claim 10, wherein the forming the silicon oxynitride layer comprises:
   forming a silicon nitride layer on the substrate, and
   exposing the silicon nitride layer to a wet oxidation to thereby convert the silicon nitride layer into the silicon oxynitride layer.

12. The method according to claim 9, wherein the forming the gate insulating layer comprises forming a high-K material layer.

13. The method according to claim 12, wherein the forming the high-K material layer comprises annealing to crystallize the high-K material layer.

14. The memory cell of claim 6, wherein the high-K material layer comprises a non-stoichiometric zirconium oxide $ZrO_x$ or hafnium oxide $HfO_x$ with an atomic percentage of Zr or Hf in the range between 50% and 90%.

15. The memory cell of claim 7, wherein the array of a plurality of memory cells is a matrix array, wherein the gates of the memory cells of one row are connected to a common wordline, the drains of the memory cells of one column are connected to a common bitline, the sources of the memory cells in one row are connected to a common source signal line, and the common source signal lines are connected to a control signal line.

16. The memory cell of claim 8, wherein a memory periphery is positioned adjacent to the array of a plurality of memory cells, wherein the memory periphery comprises logic circuits for control of read, write, and/or erase operations to the memory cells.

17. The memory cell of claim 16, wherein the memory periphery comprises transistors comprising gate dielectrics, wherein the gate dielectrics comprise $SiO_2$, $SiON$, $Al_2O_3$, $Ta_2O_5$, $HfO_2$, $ZrO_2$, $Pr_2O_3$, $Gd_2O_3$, $Y_2O_3$, $HfSiO_4$, or $ZrSiO_4$.

18. The method according to claim 12, wherein a further high-K material layer is deposited with an equivalent oxide thickness less than 1 nm on the high-K insulating layer.

19. The method according to 18, wherein the further high-K material comprises $Al_2O_3$, $Ta_2O_5$, $HfO_2$, $ZrO_2$, $Pr_2O_3$, $Gd_2O_3$, $Y_2O_3$, $HfSiO_4$, or $ZrSiO_4$.

* * * * *